(12) United States Patent
Liu (10) Patent No.: US 9,974,340 B2
(45) Date of Patent: May 22, 2018

(54) ELECTRONIC CIGARETTE

(71) Applicant: HUIZHOU KIMREE TECHNOLOGY CO., LTD. SHENZHEN BRANCH, Shenzhen, Guangdong (CN)

(72) Inventor: Qiuming Liu, Guangdong (CN)

(73) Assignee: HUIZHOU KIMREE TECHNOLOGY CO., LTD. SHENZHEN BRANCH, Shenzhen, Guangdong (CN)

(*) Notice: Subject to any disclaimer, the term of this patent is extended or adjusted under 35 U.S.C. 154(b) by 0 days. days.

(21) Appl. No.: 15/381,582

(22) Filed: Dec. 16, 2016

(65) Prior Publication Data

US 2017/0143043 A1 May 25, 2017

Related U.S. Application Data

(63) Continuation of application No. PCT/CN2014/080311, filed on Jun. 19, 2014.

(51) Int. Cl.
*A24F 47/00* (2006.01)
*G01R 19/165* (2006.01)
*H05B 1/02* (2006.01)

(52) U.S. Cl.
CPC ...... *A24F 47/008* (2013.01); *G01R 19/16542* (2013.01); *H05B 1/0244* (2013.01)

(58) Field of Classification Search
CPC ............ A24F 47/008; G01R 19/16542; H05B 1/0244
USPC .......................... 392/386, 404; 219/507, 509
See application file for complete search history.

(56) References Cited

U.S. PATENT DOCUMENTS

2008/0257367 A1 10/2008 Paterno
2014/0285937 A1 9/2014 Xiang

FOREIGN PATENT DOCUMENTS

| CN | 101524187 A | 9/2009 |
| CN | 203152489 U | 8/2013 |
| CN | 203166467 U | 8/2013 |
| CN | 203597408 U | 5/2014 |

OTHER PUBLICATIONS

International Search Report for PCT/CN2014/080311, dated Feb. 27, 2015, ISA/CN.

*Primary Examiner* — David Angwin
*Assistant Examiner* — Amit K Singh
(74) *Attorney, Agent, or Firm* — U.S. Fairsky LLP; Yue Xu (57) ABSTRACT

An electronic cigarette having a function for detecting the operating voltage and current of an atomiser. A microcontroller (102) detects the operating voltage or/and the operating current of an atomiser, and when the operating voltage or/and the operating current exceeds a threshold value, a switch circuit (103) is disconnected, so that a battery rod ceases to supply power to the atomiser, and a power supply circuit (101) of the battery rod and the atomiser is disconnected, thereby having the effect of protecting the atomiser. In addition, power supply voltage and current mismatching between the atomiser and the battery rod is prevented, said mismatching causing operational irregularities such as the amount of vapor atomised by the atomiser being unstable, and burning. The switch circuit (103) has a simple and clever structure, costs are low, and reliability is high.

10 Claims, 6 Drawing Sheets

ELECTRONIC CIGARETTE

This application is the Continuation application of International Application No. PCT/CN2014/080311, titled "ELECTRONIC CIGARETTE", and filed on Jun. 19, 2014, which is incorporated herein by reference in its entirety.

TECHNICAL FIELD

The present disclosure relates to the technical field of electronic cigarette, and in particular to an electronic cigarette having a function of detecting an operating voltage and an operating current of an atomizer.

BACKGROUND

With the improvement of health consciousness of people, more and more people realize the dangers of smoking. Therefore, electronic cigarettes which are healthy than cigarettes have become popular.

At present, most of electronic cigarettes include an atomizer and a battery rod. A heating wire is arranged inside the atomizer. When a user smokes an electronic cigarette, the battery rod powers the heating wire, to enable the heating wire to heat tobacco tar to generate vapor. In the operating process of the electronic cigarette, amplitudes of a supply voltage and a supply current of the battery rod have an effect on the atomizer. If an abnormal current such as over-current or short-circuit occurs in a circuit, components of the circuit will burn out. In addition, if a voltage across the atomizer exceeds a pre-set upper limit, components may also burn out.

In addition, when using an electronic cigarette, a user sometimes uses any combination of atomizers and battery rods of electronic cigarettes produced by different manufacturers. A supply voltage and a supply current of the atomizer may not match that of the battery rod, which results in abnormal operation phenomenon such as unstable atomized vapor volume of the atomizer and charring. Therefore, user experience is poor, the user perception of manufacturers and brands is hindered, and it is not disadvantageous for smoking cessation.

SUMMARY

In view of the above, an electronic cigarette having a function of detecting an operating voltage and an operating current of an atomizer with the low cost and the high reliability is provided according to the present disclosure. The electronic cigarette includes a battery rod, an atomizer and a power supply circuit.

The battery rod is provided with a power supply electrode of battery rod configured to power components inside the electronic cigarette.

The atomizer is provided with a power supply terminal of atomizer configured to receive the power supplied by the battery rod.

The power supply electrode of battery rod is electrically connected to the power supply terminal of atomizer via the power supply circuit.

The power supply circuit includes a switch circuit and a microcontroller.

The switch circuit is electrically connected to the microcontroller, and is configured to turn on or turn off the power supply circuit.

The microcontroller is configured to detect an operating voltage and/or an operating current of the atomizer, and to turn off the switch circuit to stop the battery rod powering the atomizer in a case that the operating voltage and/or the operating current exceed a threshold.

The switch circuit includes a triode, a field effect transistor, a first resistor, a second resistor and a first voltage division resistor.

The microcontroller is provided with a first control pin and a first feedback pin.

A base of the triode is electrically connected to the first control pin via the first resistor, so that the microcontroller turns on or turns off the triode via the first control pin.

An emitter of the triode is grounded, and a collector of the triode is electrically connected to a gate of the field effect transistor and to the power supply electrode of battery rod via the second resistor, so that the field effect transistor is turned on after the triode is turned on.

A drain of the field effect transistor is electrically connected to the power supply electrode of battery rod, and a source of the field effect transistor is electrically connected to the power supply terminal of atomizer, so that the battery rod powers the atomizer in a case that the field effect transistor is turned on.

A first terminal of the first voltage division resistor is electrically connected to the first feedback pin, and a second terminal of the first voltage division resistor is electrically connected to the source of the field effect transistor and the power supply terminal of atomizer, so that an operating voltage of the atomizer is fed back to the microcontroller via the first feedback pin, and the microcontroller turns off the field effect transistor by turning off the triode, and turns off the battery rod to stop powering the atomizer, in a case that the operating voltage of the atomizer exceeds a pre-set threshold.

Optionally, the switch circuit further includes a third resistor and a sense resistor. The microcontroller is further provided with a second control pin. The second control pin is electrically connected to the power supply terminal of atomizer via the third resistor. A first terminal of the sense resistor is grounded, and a second terminal of the sense resistor is electrically connected to the power supply terminal of atomizer and to the second control pin via the third resistor, so that the microcontroller computes a current flowing through the sense resistor by detecting a voltage drop across the sense resistor, turns off the triode to turn off the field effect transistor and turns off the battery rod to stop powering the atomizer in a case that the current of the atomizer is abnormal.

Optionally, the switch circuit further includes a battery rod voltage detection circuit.

The battery rod voltage detection circuit includes a second voltage division resistor, a third voltage division resistor and a capacitor.

The microcontroller is further provided with a first detection pin and a second detection pin.

The second voltage division resistor is connected in series to the third voltage division resistor and is electrically connected to the power supply electrode of battery rod.

The third voltage division resistor is connected in parallel to the capacitor, and two terminals of the third voltage division resistor and the capacitor are electrically connected to the first detection pin and the second detection pin respectively, so that the microcontroller detects an output voltage of a battery, turns off the triode to turn off the field effect transistor and turns off the battery rod to stop powering the atomizer in a case that the output voltage of the battery exceeds the pre-set threshold.

Optionally, the battery rod voltage detection circuit further includes a fourth resistor and a LED lamp. The microcontroller is further provided with a LED lamp control pin. A first terminal of the LED lamp is electrically connected to the power supply electrode of battery rod via the fourth resistor, and a second terminal of the LED lamp is electrically connected to the LED lamp control pin. The LED lamp is configured to display an operation state of the battery rod voltage detection circuit based on the control of the microcontroller.

Optionally, the switch circuit further includes a smoking control circuit.

The microcontroller is further provided with a first smoking control pin and a second smoking control pin.

The smoking control circuit is provided with a button switch.

Two terminals of the button switch are electrically connected to the first smoking control pin and the second smoking control pin respectively, and the first smoking control pin is electrically connected to the power supply electrode of battery rod, so that the first smoking control pin is electrically connected to the second smoking control pin in a case that a user smokes the electronic cigarette and presses the button switch, and the microcontroller turns on the triode via the first control pin and turns on the field effect transistor to allow the battery rod to power the atomizer.

Optionally, the smoking control circuit is further provided with a display screen and a button counter.

The button counter is configured to record the number of times that the button switch is pressed and accumulate a total number of times.

The display screen is electrically connected to the button counter, the button switch and the microcontroller and is configured to display the number of times that the button switch is pressed.

Optionally, the display screen is provided with a display circuit, a power supply terminal of display screen microcontroller and a power supply terminal of display screen electrode.

The display circuit includes a first triode of display screen, a second triode of display screen and a third triode of display screen.

The microcontroller is further provided with a display control pin.

The display control pin is electrically connected to a base of the first triode of display screen, so that the microcontroller turns on the first triode of display screen.

An emitter of the first triode of display screen is electrically connected to the battery rod power supply electrode, and a collector of the first triode of display screen is electrically connected to the power supply terminal of display screen microcontroller, so that the power supply electrode of battery rod powers the power supply terminal of display screen microcontroller in a case that the first triode of display screen is turned on.

The collector of the first triode of display screen is further electrically connected to a base of the second triode of display screen, so that the second triode of display screen is turned on in a case that the first triode of display screen is turned on.

A collector of the second triode of display screen is electrically connected to a base of the third triode of display screen, an emitter of the third triode of display screen is electrically connected to the power supply electrode of battery rod, and a collector of the third triode of display screen is connected to the power supply terminal of display screen electrode, so that the third triode of display screen is turned on in a case that the second triode of display screen is turned on, and allows the power supply electrode of battery rod to power the power supply terminal of display screen electrode.

The display screen displays normally, after both the power supply terminal of display screen microcontroller and the power supply terminal of display screen electrode are powered by the power supply electrode of battery rod.

Optionally, the power supply circuit further includes a voltage regulator circuit configured to stabilize an operating voltage of the microcontroller provided by the battery rod.

The voltage regulator circuit is provided with a diode and a voltage regulator.

The diode is connected in series to the voltage regulator.

An anode of the diode is electrically connected to the power supply terminal of battery rod, and a cathode of the diode is electrically connected to an input terminal of the voltage regulator, which prevents the diode from being turned on in a direction of current.

Optionally, the voltage regulator circuit is provided with a storage capacitor.

A first terminal of the storage capacitor is electrically connected to an output terminal of the voltage regulator and the power supply terminal of the microcontroller, a second terminal of the storage capacitor is grounded, and the storage capacitor is to power the microcontroller after the power supply circuit cuts off the power supply of the battery rod.

Optionally, the power supply circuit further includes a battery charging protection circuit.

The battery charging protection circuit is provided with a charging control module and a charging circuit.

The charging control module is electrically connected to the charging circuit.

The charging control module is configured to detect a charging voltage and a charging current of the battery rod, and to control the charging circuit to turn off a charging loop in a case that the charging voltage is too high and/or the charging current is too large.

The charging circuit includes two field effect transistors, and drains of the two field effect transistors are electrically connected to each other.

It can be seen that the present disclosure has the following beneficial effects. A microcontroller detects an operating voltage and/or an operating current of an atomizer. In a case that the operating voltage and/or the operating current exceed a threshold, the microcontroller turns off a switch circuit to stop a battery rod powering the atomizer, thereby turning off a power supply circuit between the battery rod and the atomizer, and protecting the atomizer. In addition, when using an electronic cigarette, a user sometimes uses any combination of atomizers and battery rods of electronic cigarettes produced by different manufacturers. A supply voltage and a supply current of the atomizer may not match that of the battery rod, which results in abnormal operation phenomenon such as unstable atomized vapor volume of the atomizer and charring. Therefore, user experience is poor, the user perception of manufacturers and brands is hindered, and it is not disadvantageous for smoking cessation. The switch circuit has a simple and skillful structure, a low cost and a high reliability.

BRIEF DESCRIPTION OF THE DRAWINGS

Hereinafter the present disclosure will be further described in conjunction with drawings and embodiments.

DETAILED DESCRIPTION OF THE EMBODIMENTS

Figure 1:
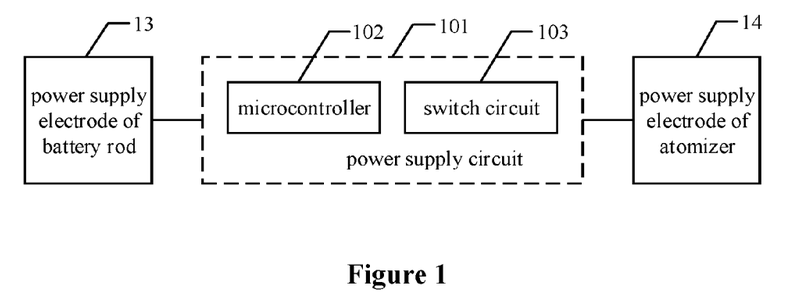
FIG. 1 is a diagram of an entirety of an electronic cigarette according to the present disclosure.

An electronic cigarette having a function of detecting an operating voltage and an operating current of an atomizer is provided according to the present disclosure. Reference is made to FIG. 1. The electronic cigarette includes a battery rod, an atomizer and a power supply circuit 101. The battery rod is provided with a power supply electrode of battery rod 13 configured to power components inside the electronic cigarette. The atomizer is provided with a power supply terminal of atomizer 14 configured to receive the power supplied by the battery rod. The power supply electrode of battery rod 13 is electrically connected to the power supply terminal of atomizer 14 via the power supply circuit 101. The power supply circuit 101 includes a switch circuit 103 and a microcontroller 102. The switch circuit 103 is electrically connected to the microcontroller 102 and is configured to turn on or turn off the power supply circuit 101. The microcontroller 102 is configured to detect an operating voltage and/or an operating current of the atomizer, and to turn off the switch circuit 103 to stop the battery rod powering the atomizer in a case that the operating voltage and/or the operating current exceed a threshold.

It can be seen that the microcontroller 102 detects the operating voltage and/or the operating current of the atomizer, and turns off the switch circuit to stop the battery rod powering the atomizer in a case that the operating voltage and/or the operating current exceed the threshold, thereby turning off the power supply circuit between the battery rod and the atomizer and protecting the atomizer. In addition, when using an electronic cigarette, a user sometimes uses any combination of atomizers and battery rods of electronic cigarettes produced by different manufacturers. A supply voltage and a supply current of the atomizer may not match that of the battery rod, thereby resulting in abnormal operation of the battery rod and the atomizer. The microcontroller may also control the switch circuit to turn off the power supply circuit between the battery rod and the atomizer, thereby avoiding abnormal operation phenomenon such as an unstable atomized vapor volume of the atomizer and charring. Therefore, user experience is poor, the user perception of manufacturers and brands is hindered, and it is disadvantageous for smoking cessation.

To describe the present disclosure fully, hereinafter specific implementation circuits are described for illustration of the present disclosure, but the implementation circuits according to the embodiments are not to limit the present disclosure.

Figure 2:
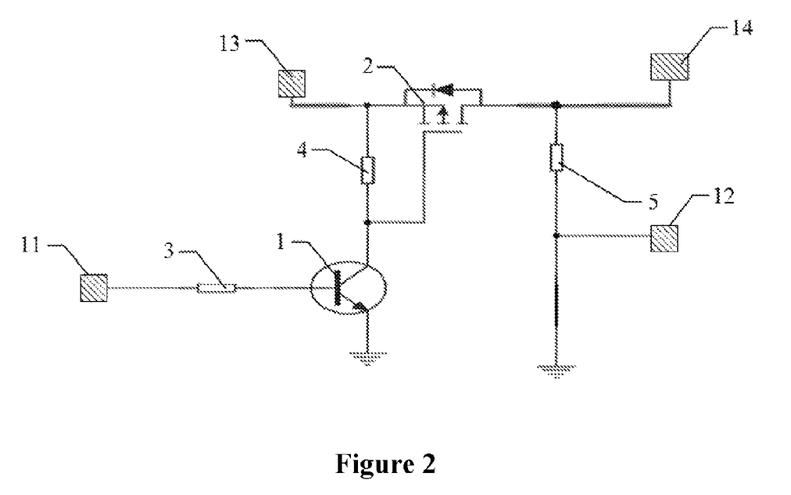
FIG. 2 is a diagram of an operating voltage detecting and controlling circuit of an atomizer of an electronic cigarette according to the present disclosure.

In the embodiment, reference is made to FIG. 2. The power supply circuit 101 includes a triode 1, a field effect transistor 2, a first resistor 3, a second resistor 4 and a first voltage division resistor 5. The microcontroller 102 is provided with a first control pin 11 and a first feedback pin 12. The base of the triode 1 is electrically connected to the first control pin 11 via the first resistor 3, thereby enabling the microcontroller 102 to turn on the triode 1 via the first control pin 11.

The emitter of the triode 1 is grounded, and the collector of the triode 1 is electrically connected to the gate of the field effect transistor 2 and to the power supply electrode of battery rod 13 via the second resistor 4, thereby enabling the field effect transistor 2 to be turned on after the triode 1 is turned on. The on-off control of the field effect transistor 2 is driven by the triode 1. The structure is simple, the cost is low, the reliability is high, and problems of high cost and poor reliability caused by complicated chips or circuits are avoided.

The drain of the field effect transistor 2 is electrically connected to the power supply electrode of battery rod 13, and the source of the field effect transistor 2 is electrically connected to the power supply terminal of atomizer 14, thereby enabling the battery rod to power the atomizer in a case that the field effect transistor 2 is turned on. Such a connection structure takes full advantages of a small internal resistance of the field effect transistor 2, so that a heating productivity of a large current flowing through the field effect transistor 2 is small, and the energy loss is low, thereby improving the security of the electronic cigarette, avoiding problems such as a high heating productivity caused by a large current due to components with a high internal resistance such as a triode.

A first terminal of the first voltage division resistor 5 is electrically connected to the first feedback pin 12, and a second terminal of the first voltage division resistor 5 is electrically connected to the source of the field effect transistor 2 and to the power supply terminal of atomizer 14. In such a way, the operating voltage of the atomizer is fed back to the microcontroller 102 via the first feedback pin 12, and the microcontroller 102 turns off the field effect transistor 2 by turning off the triode 1 in a case that the operating voltage of the atomizer exceeds the pre-set threshold. Therefore, the battery rod is turned off and stops powering the atomizer.

It can be understood that, the operating voltage of the atomizer is fed back to the microcontroller 102 via the first feedback pin 12. In a case that the operating voltage of the atomizer exceeds the pre-set threshold, the microcontroller 102 turns off the field effect transistor 2 by turning off the triode 1. Therefore, the battery rod is turned off and stops powering the atomizer. In such a way, the microcontroller 102 can monitor the operating voltage of the atomizer in a real-time manner, and turn off the triode 1 once the operating voltage of the atomizer exceeds the pre-set threshold. Therefore, the battery rod is turned off and stops powering the atomizer, and the atomizer is protected.

Figure 3:
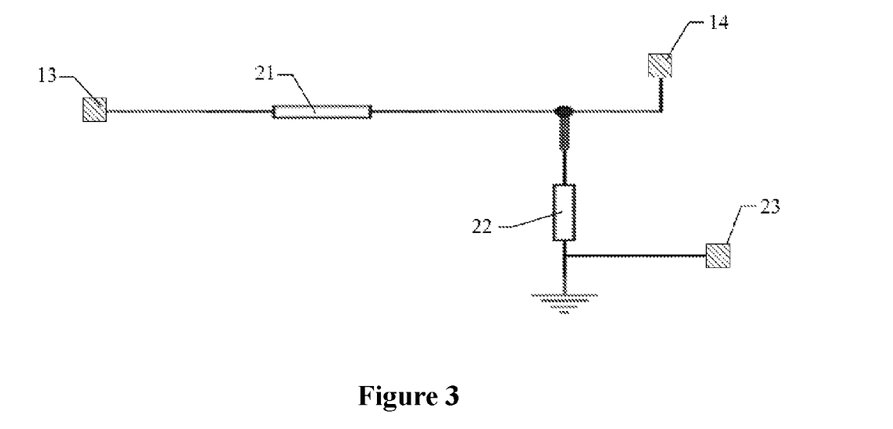
FIG. 3 is a diagram of an operating current detecting and controlling circuit of an atomizer of an electronic cigarette according to the present disclosure.

In the embodiment, a current of the atomizer may be detected, and abnormality of the current of the atomizer is prevented. For example, when over-current or short-circuit occurs, the microcontroller 102 can turn off the battery rod in a real-time manner, and the battery rod stops powering the atomizer, thereby protecting the atomizer. Reference is made to FIG. 3.

The switch circuit further includes a third resistor 21 and a sense resistor 22.

The microcontroller 102 is further provided with a second control pin 23.

The second control pin 23 is electrically connected to the power supply terminal of atomizer 14 via the third resistor 21. A first terminal of the sense resistor 22 is grounded, and a second terminal of the sense resistor 22 is electrically connected to the power supply terminal of atomizer 14 and to the second control pin 23 via the third the resistor. In such a way, the microcontroller 102 may compute a current flowing through the sense resistor by detecting a voltage drop across the sense resistor. In a case that the current of the atomizer is abnormal, the microcontroller 102 turns off the triode 1 to turn off the field effect transistor 2. Therefore, the battery rod is turned off and stops powering the atomizer.

Figure 4:
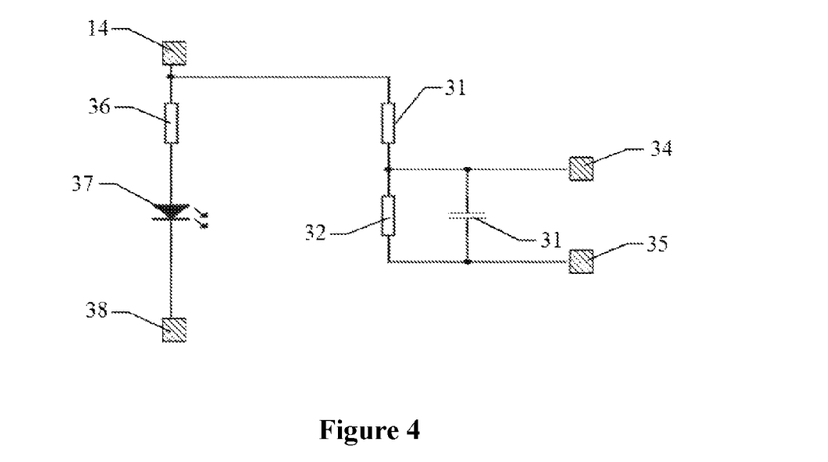
FIG. 4 is a diagram of an operating voltage detecting and controlling circuit of a battery rod of an electronic cigarette according to the present disclosure.

In the embodiment, in order to detect the operating voltage and the operating current of the atomizer and an operating voltage outputted by the battery rod, the switch circuit 103 as shown in FIG. 4 further includes a battery rod voltage detection circuit.

The battery rod voltage detection circuit includes a second voltage division resistor 31, a third voltage division resistor 32 and a capacitor 33.

The microcontroller 102 is further provided with a first detection pin 34 and a second detection pin 35.

The second voltage division resistor 31 is connected in series to the third voltage division resistor 32 and is electrically connected to the power supply electrode of battery rod 13.

The third voltage division resistor 32 is connected in parallel to the capacitor 33, and two terminals of the third voltage division resistor 32 and the capacitor 33 are electrically connected to the first detection pin 34 and the second detection pin 35 respectively. In such a way, the microcontroller 102 may detect an output voltage of a battery. In a case that the output voltage of the battery exceeds the pre-set threshold, the microcontroller 102 turns off the triode 1 to turn off the field effect transistor 2. Therefore, the battery rod is turned off and stops powering the atomizer.

In the embodiment, the battery rod voltage detection circuit further includes a fourth resistor 36 and a LED lamp 37. The microcontroller 102 is further provided with a LED lamp control pin 38. A first terminal of the LED lamp 37 is electrically connected to the power supply electrode of battery rod 13 via the fourth resistor 36, a second terminal of the LED lamp 37 is electrically connected to the LED lamp control pin 38, and the LED lamp 37 is configured to display an operation state of the battery rod voltage detection circuit based on the control of the microcontroller 102. In such a way, the microcontroller 102 can detect the operating voltage and the operating current of the atomizer, and can further detect a supply voltage outputted by the battery rod, and therefore, double protection for the atomizer is achieved.

In a case that the battery rod supplies power normally, the LED light may display one color. In a case that the battery rod supplies power abnormally, the LED light may display another color. For example, in a case that the battery rod supplies power normally, the LED light may display a green color. In a case that the battery rod supplies power abnormally, the LED light may display a red color. Specific colors are not limited herein, which are merely to prompt a user.

In daily smoking of an electronic cigarette, it is difficult for a user to know or count the number of times of smoking, i.e., how many times the user has smoked the electronic cigarette in one day or in a period of time, or how many times the user can smoke in a case the battery rod is fully charged. In the embodiment, reference is made to FIG. 5. The switch circuit further includes a smoking control circuit. The microcontroller 102 is further provided with a first smoking control pin 42 and a second smoking control pin 43. The smoking control circuit is provided with a button switch 41. Two terminals of the button switch 41 are electrically connected to the first smoking control pin 42 and the second smoking control pin 43 respectively, and the first smoking control pin 42 is electrically connected to the power supply electrode of battery rod 13. In such a way, when smoking an electronic cigarette, a user presses the button switch 41 to electrically connect the first smoking control pin 42 to the second smoking control pin 43, thereby enabling the microcontroller 102 to turn on the triode 1 via the first control pin 11. Hence, the field effect transistor 2 is turn on, and the battery rod powers the atomizer.

Figure 5:
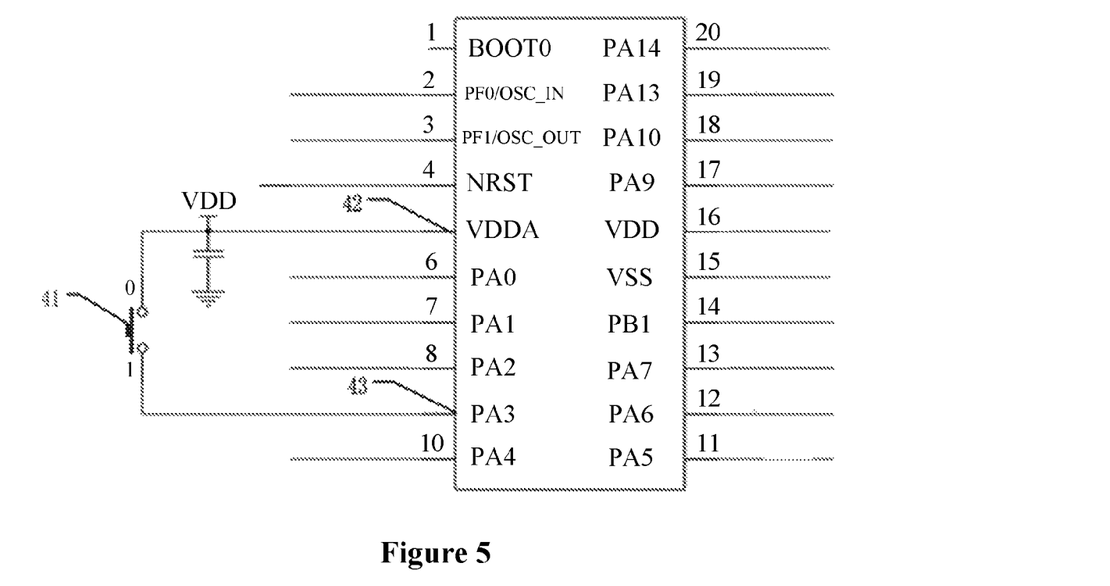
FIG. 5 is a diagram of a button switch controlling circuit of an electronic cigarette according to the present disclosure.

The smoking control circuit is further provided with a display screen 51 and a button counter. The button counter is configured to record the number of times that the button switch is pressed and accumulate the total number of times. The display screen 51 is electrically connected to the button counter, the button switch 41 and the microcontroller 102, and is configured to display the number of times that the button switch is pressed.

In such a way, when smoking an electronic cigarette, a user needs to press the button switch 41 to allow the battery rod to power the atomizer and to allow the atomizer to generate vapor. Each time the button switch 41 is pressed, the button counter records the number of times that the button switch is pressed, and the display screen displays the number of times that the button switch is pressed and the total number of times. A control panel of the display screen may also be provided to allow the number of times to be reset and recalculated. The user may know how many times he has smoked the electronic cigarette in one day or in a period of time. The user may also learn about a relation between the number of times for smoking and the remaining power, i.e., how many times the user can smoke in a case the battery rod is fully charged, and how many times the user can smoke in a case a half of the power remains. In such a way, the case where the user can not smoke if he is unclear about a power state of the electronic cigarette before going out and finds low power when he wants to smoke after going out can be avoided.

Figure 6:
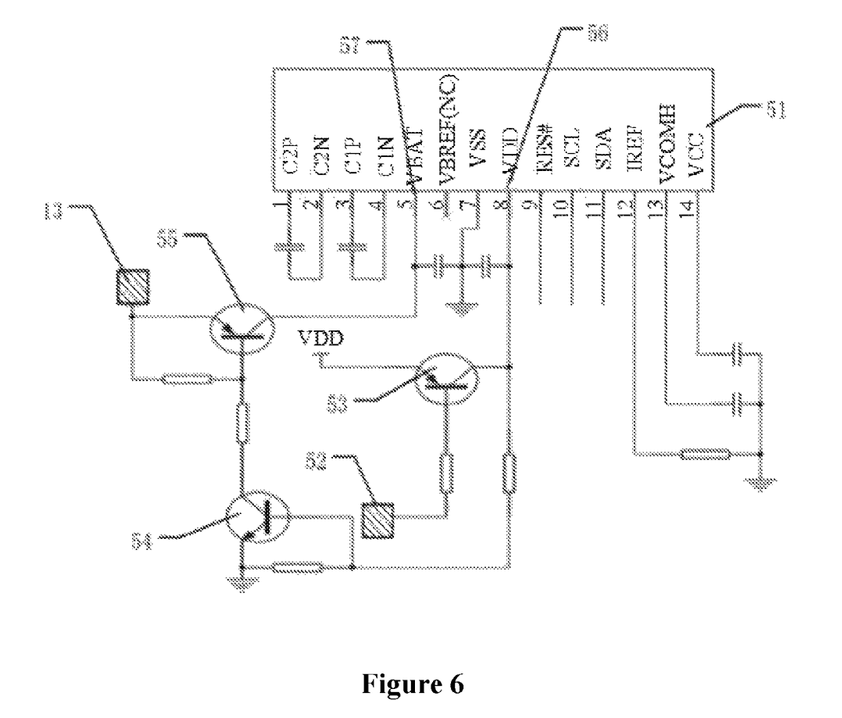
FIG. 6 is a diagram of a display screen and a peripheral circuit of an electronic cigarette according to the present disclosure.

In the embodiment, reference is made to FIG. 6. The display screen is provided with a display circuit, a power supply terminal of display screen microcontroller 56 and a power supply terminal of display screen electrode 57. The display circuit includes a first triode of display screen 53, a second triode of display screen 54 and a third triode of display screen 55. The microcontroller 102 is further provided with a display screen control pin 52. The display screen control pin 52 is electrically connected to the base of the first triode of display screen 53, thereby enabling the microcontroller 102 to turn on the first triode of display screen 53. The emitter of the first triode of display screen 53 is electrically connected to the battery rod power supply electrode 13, and the collector of the first triode of display screen 53 is electrically connected to the power supply terminal of display screen microcontroller 56, thereby enabling the power supply electrode of battery rod 13 to power the power supply terminal of display screen microcontroller 56 in a case that the first triode of display screen 53 is turned on.

The collector of the first triode of display screen 53 is further electrically connected to the base of the second triode of display screen 54, thereby enabling the second triode of display screen 54 to be turned on in a case that the first triode of display screen 53 is turned on.

The collector of the second triode of display screen 54 is electrically connected to the base of the third triode of display screen 55. The emitter of the third triode of display screen 55 is electrically connected to the power supply electrode of battery rod 13, and the collector of the third triode of display screen 55 is connected to the power supply terminal of display screen electrode 57, thereby enabling the third triode of display screen 55 to be turned on in a case that the second triode of display screen 54 is turned on, and enabling the power supply electrode of battery rod 13 to power the power supply terminal of display screen electrode 57.

After both the power supply terminal of display screen microcontroller 56 and the power supply terminal of display screen electrode 57 are powered by the power supply electrode of battery rod 13, the display screen displays normally.

It can be seen that the on-off of the display screen is controlled by the microcontroller 102. In such a way, if a voltage or current abnormality occurs in the circuit, the microcontroller 102 can turn off the display screen in time, thereby protecting the display screen.

Figure 7:
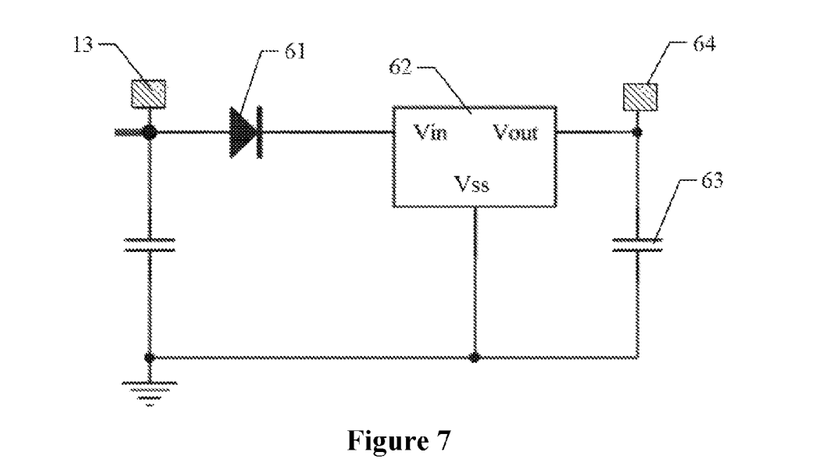
FIG. 7 is a diagram of a voltage regulator circuit of an electronic cigarette according to the present disclosure.

In order to provide a stable operating voltage to the microcontroller 102 in the embodiment, the power supply circuit 103 further includes a voltage regulator circuit configured to stabilize the operating voltage of the microcontroller provided by the battery rod. Reference is made to FIG. 7.

The voltage regulator circuit is provided with a diode 61 and a voltage regulator 62.

The diode 61 is connected in series to the voltage regulator 62.

An anode of the diode 61 is electrically connected to the power supply terminal of battery rod 13, and a cathode of the diode 61 is electrically connected to an input terminal of the voltage regulator 62, which prevents the diode 61 to be turned on in a direction of current.

Since a diode has functions of forward conducting and reverse blocking, the diode can prevent turning on in a direction of current. The voltage regulator 62 in the voltage regulator circuit has a function of voltage stabilization. Specifically, the voltage regulator may adopt a type of TLV70430, and the specific type is not limited herein.

In the embodiment, the voltage regulator circuit is provided with a storage capacitor 63.

A first terminal of the storage capacitor 63 is electrically connected to an output terminal of the voltage regulator 62 and to the power supply terminal of the microcontroller 102, and a second terminal of the storage capacitor 63 is grounded, thereby enabling the storage capacitor 63 to power the microcontroller 102 after the power supply circuit 102 is turned off and stops powering the battery rod. Therefore, the microcontroller 102 has a buffer time to close relevant programs and end the progresses, and the microcontroller 102 is protected.

Figure 8:
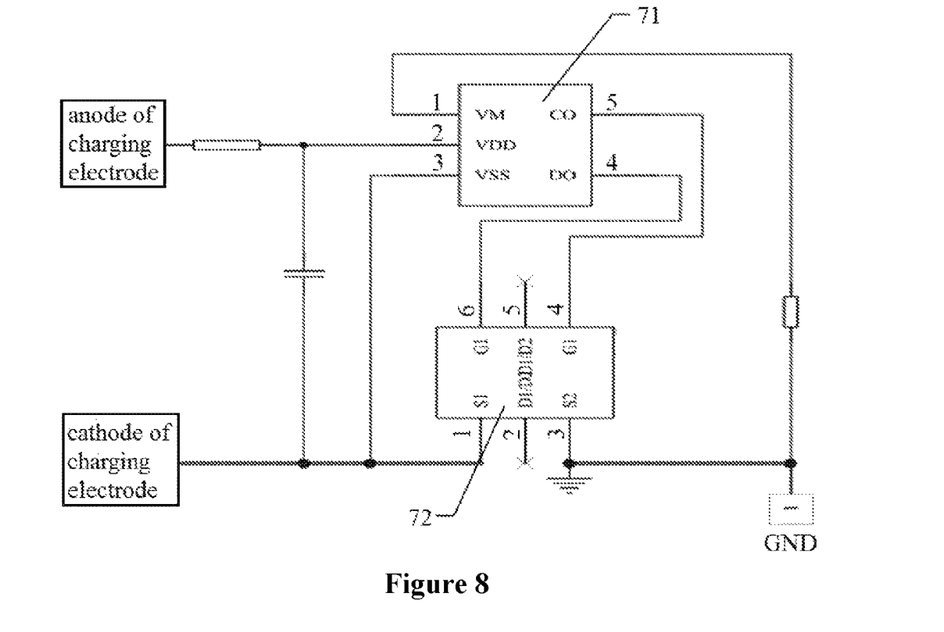
FIG. 8 is a diagram of a charging protection circuit of an electronic cigarette according to the present disclosure.
Figure 9:
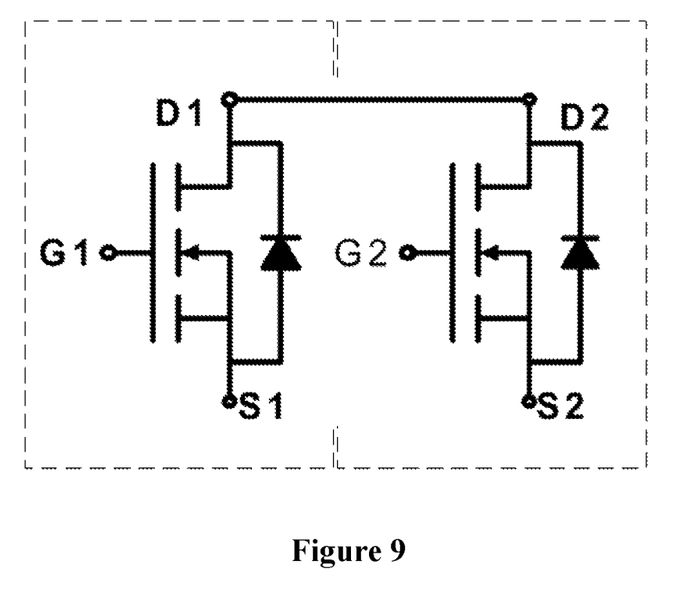
FIG. 9 is a diagram of a charging circuit for a charging protection circuit of an electronic cigarette according to the present disclosure.

In the embodiment, reference is made to FIG. 8 and FIG. 9. The power supply circuit 102 further includes a battery charging protection circuit. The battery charging protection circuit is provided with a charging control module 71 and a charging circuit 72. The charging control module 71 is electrically connected to the charging circuit 72. The charging control module 71 is configured to detect a charging voltage and a charging current of the battery rod, and to control the charging circuit 72 to turn off the charging loop in a case that the charging voltage is too high and/or the charging current is too large. The charging circuit includes two field effect transistors, and the drains of the two field effect transistors are electrically connected to each other.

The charging control module 71 may adopt an S8241 circuit, which is configured to control the charge and discharge by monitoring a voltage of a battery connected between VDD and VSS and monitoring a voltage difference between VM and VSS. The charging circuit 72 may be a DT8205 circuit, and the DT8205 circuit is equivalent to two field effect transistors.

In the present disclosure, the microcontroller may be STM32F030F6, and the specific types are not limited herein.

The invention claimed is:

1. An electronic circuit for electronic cigarette, comprising:
   a battery rod, provided with a power supply electrode of battery rod configured to power components inside the electronic cigarette;
   an atomizer, provided with a power supply terminal of atomizer configured to receive the power supplied by the battery rod; wherein
     the power supply electrode of battery rod is electrically connected to the power supply terminal of atomizer via a power supply circuit;
   the power supply circuit, comprising a switch circuit and a microcontroller; wherein
     the switch circuit is electrically connected to the microcontroller, and is configured to turn on or turn off the power supply circuit;
     the microcontroller is configured to detect an operating voltage and/or an operating current of the atomizer, and to turn off the switch circuit to stop the battery rod powering the atomizer in a case that the operating voltage and/or the operating current exceed a threshold;
     the switch circuit comprises a triode, a field effect transistor, a first resistor, a second resistor and a first voltage division resistor;
     the microcontroller is provided with a first control pin and a first feedback pin;
     a base of the triode is electrically connected to the first control pin via the first resistor, so that the microcontroller turns on or turns off the triode via the first control pin;
     an emitter of the triode is grounded, and a collector of the triode is electrically connected to a gate of the field effect transistor and to the power supply electrode of battery rod via the second resistor, so that the field effect transistor is turned on after the triode is turned on;
     a drain of the field effect transistor is electrically connected to the power supply electrode of battery rod, and a source of the field effect transistor is electrically connected to the power supply terminal of atomizer, so that the battery rod powers the atomizer in a case that the field effect transistor is turned on; and
     a first terminal of the first voltage division resistor is electrically connected to the first feedback pin, and a second terminal of the first voltage division resistor is electrically connected to the source of the field effect transistor and the power supply terminal of atomizer, so that an operating voltage of the atomizer is fed back to the microcontroller via the first feedback pin, and the microcontroller is configured to turn off the field effect transistor by turning off the triode, and turn off the battery rod to stop powering the atomizer, in a case that the operating voltage of the atomizer exceeds a pre-set threshold.

2. The electronic circuit for electronic cigarette according to claim 1, wherein the switch circuit further comprises a third resistor and a sense resistor;

the microcontroller is further provided with a second control pin; and the second control pin is electrically connected to the power supply terminal of atomizer via the third resistor; a first terminal of the sense resistor is grounded, and a second terminal of the sense resistor is electrically connected to the power supply terminal of atomizer and to the second control pin via the third resistor, so that the microcontroller is configured to compute a current flowing through the sense resistor by detecting a voltage drop across the sense resistor, and turn off the triode to turn off the field effect transistor and is configured to turn off the battery rod to stop powering the atomizer in a case that over-current or short-circuit occurs in the atomizer.

3. The electronic circuit for electronic cigarette according to claim 2, wherein the switch circuit further comprises a battery rod voltage detection circuit;

the battery rod voltage detection circuit comprises a second voltage division resistor, a third voltage division resistor and a capacitor;

the microcontroller is further provided with a first detection pin and a second detection pin;

the second voltage division resistor is connected in series to the third voltage division resistor and is electrically connected to the power supply electrode of battery rod; and the third voltage division resistor is connected in parallel to the capacitor, and two terminals of the third voltage division resistor and the capacitor are electrically connected to the first detection pin and the second detection pin respectively, so that the microcontroller is configured to detect an output voltage of a battery, and turn off the triode to turn off the field effect transistor and is configured to turn off the battery rod to stop powering the atomizer in a case that the output voltage of the battery exceeds the pre-set threshold.

4. The electronic circuit for electronic cigarette according to claim 3, wherein the battery rod voltage detection circuit further comprises a fourth resistor and a LED lamp;

the microcontroller is further provided with a LED lamp control pin; and a first terminal of the LED lamp is electrically connected to the power supply electrode of battery rod via the fourth resistor, a second terminal of the LED lamp is electrically connected to the LED lamp control pin, and the LED lamp is configured to display an operation state of the battery rod voltage detection circuit based on the control of the microcontroller.

5. The electronic circuit for electronic cigarette according to claim 1, wherein the switch circuit further comprises a smoking control circuit;

the microcontroller is further provided with a first smoking control pin and a second smoking control pin;

the smoking control circuit is provided with a button switch; and two terminals of the button switch are electrically connected to the first smoking control pin and the second smoking control pin respectively, and the first smoking control pin is electrically connected to the power supply electrode of battery rod, so that the first smoking control pin is electrically connected to the second smoking control pin in a case that a user smokes the electronic cigarette and presses the button switch, and the microcontroller is configured to turn on the triode via the first control pin and turn on the field effect transistor to allow the battery rod to power the atomizer.

6. The electronic circuit for electronic cigarette according to claim 5, wherein the smoking control circuit is further provided with a display screen and a button counter;

the button counter is configured to record the number of times that the button switch is pressed and accumulate a total number of times; and the display screen is electrically connected to the button counter, the button switch and the microcontroller and is configured to display the number of times that the button switch is pressed.

7. The electronic circuit for electronic cigarette according to claim 5, wherein the display screen is provided with a display circuit, a power supply terminal of display screen microcontroller and a power supply terminal of display screen electrode;

the display circuit comprises a first triode of display screen, a second triode of display screen and a third triode of display screen;

the microcontroller is further provided with a display control pin;

the display control pin is electrically connected to a base of the first triode of display screen, so that the microcontroller turns on the first triode of display screen;

an emitter of the first triode of display screen is electrically connected to the battery rod power supply electrode, and a collector of the first triode of display screen is electrically connected to the power supply terminal of display screen microcontroller, so that the power supply electrode of battery rod powers the power supply terminal of display screen microcontroller in a case that the first triode of display screen is turned on;

the collector of the first triode of display screen is further electrically connected to a base of the second triode of display screen, so that the second triode of display screen is turned on in a case that the first triode of display screen is turned on;

a collector of the second triode of display screen is electrically connected to a base of the third triode of display screen, an emitter of the third triode of display screen is electrically connected to the power supply electrode of battery rod, and a collector of the third triode of display screen is connected to the power supply terminal of display screen electrode, so that the third triode of display screen is turned on in a case that the second triode of display screen is turned on, and allows the power supply electrode of battery rod to power the power supply terminal of display screen electrode; and the display screen displays normally, after both the power supply terminal of display screen microcontroller and the power supply terminal of display screen electrode are powered by the power supply electrode of battery rod.

8. The electronic circuit for electronic cigarette according to claim 1, wherein
the power supply circuit further comprises a voltage regulator circuit configured to stabilize an operating voltage of the microcontroller provided by the battery rod;
the voltage regulator circuit is provided with a diode and a voltage regulator;
the diode is connected in series to the voltage regulator; and
an anode of the diode is electrically connected to the power supply terminal of battery rod, and a cathode of the diode is electrically connected to an input terminal of the voltage regulator, which prevents the diode from being turned on in a direction of current.

9. The electronic circuit for electronic cigarette according to claim 8, wherein
the voltage regulator circuit is provided with a storage capacitor; and
a first terminal of the storage capacitor is electrically connected to an output terminal of the voltage regulator and the power supply terminal of the microcontroller, a second terminal of the storage capacitor is grounded, and the storage capacitor is to power the microcontroller after the power supply circuit cuts off the power supply of the battery rod.

10. The electronic circuit for electronic cigarette according to claim 1, wherein
the power supply circuit further comprises a battery charging protection circuit;
the battery charging protection circuit is provided with a charging control module and a charging circuit;
the charging control module is electrically connected to the charging circuit;
the charging control module is configured to detect a charging voltage and a charging current of the battery rod, and to control the charging circuit to turn off a charging loop in a case that the charging voltage exceeds a second threshold and/or the charging current exceeds a third threshold; and
the charging circuit comprises two field effect transistors, and drains of the two field effect transistors are electrically connected to each other.

* * * * *